United States Patent Office 2,819,164

Patented Jan. 7, 1958

2,819,164

METHOD OF MANUFACTURING METALLIC PATTERNS

Theo Tjalke Boersma, Eindhoven, Netherlands, assignor, by mesne assignments, to North American Philips Company, Inc., New York, N. Y., a corporation of Delaware No Drawing. Application November 16, 1953
Serial No. 392,465

Claims priority, application Netherlands
November 29, 1952

2 Claims. (Cl. 96—35)

This application is a continuation-in-part of application Ser. No. 363,696, filed June 23, 1953.

Said application Ser. No. 363,696 is directed to a method of producing tanned images on a carrier in which a layer consisting of polyvinyl butyral resin and containing a photo-sensitive bichromate compound is applied to a carrier. The layer is then selectively exposed to the actinic light which further polymerizes the exposed regions to an insoluble condition and the unexposed soluble portions are then washed away.

The invention relates to a method of producing metallic patterns and to metallic patterns produced by this method.

It is known to use a method for manufacturing patterns, in which a body is provided with a layer of a light-sensitive system based on the variation in the solubility owing to exposure, this layer being exposed to light through a stencil, after which the parts still soluble are washed away and a substance is applied to or removed from the areas where the layer has been washed away. This manufacture of objects comprises both the essential formation and the use for technical and decoration purposes. One of the many uses of such a method is the manufacture of printing plates for e. g. offset printing, plane printing or copperplate printing.

For the uses referred to above, this reference not being exhaustive for the technical fields in which use may be made of the variation in solubility of a light-sensitive layer owing to exposure, it is of great importance that the light-sensitive layer should adhere strongly to the object, which may be made of metal or of a non-conductive material. Moreover, in those uses, in which the washed copy is subjected to an additional chemical treatment, it is very desirable that the exposed light-sensitive layer should resist the action of the chemical substances to be used. The invention fulfils these requirements in a particularly efficient manner.

The invention relates to a method of producing metallic patterns and is characterized in that polyvinylbutyral with a substance producing together with polyvinylbutyral a light-sensitive system is used as a light-sensitive system.

Substances capable of producing a light-sensitive system with polyvinylbutyral may be chromates, bichromates, for example, the K- or $NH_4$-salts thereof, light-sensitive diazo- or diazonium compounds, such for example, as 4-amino-1-(N-methyl-6-naphthalene-tetrahydride-1.2.3.4)-aminobenzene.

It is advisable to choose the polymerisation degree of the polyvinylbutyral to be such that the viscosity of a 10% solution of polyvinylbutyral in ethanol lies between 200 and 1000 centipoises, preferably between 400 and 600 centipoises.

For those uses in which the ink absorbability of the exposed layer is of importance, it is advantageous to add a natural resin, for example, collophonium or shellac to the layer.

The layer is preferably applied a short time prior to the exposure. For this purpose a solution of polyvinylbutyral and substances producing a light-sensitive system therewith, may be applied to the surface. Use is preferably made of a monophase-mixture of two solutions of the components, obtained for example, by mixing a solution of polyvinylbutyral in a low aliphatic alcohol or mixtures thereof with an aqueous solution of chromate or bichromate salt.

*Example 1*

5 g. of polyvinylbutyral with a butyral content of about 75%, a vinyl-alcohol content of about 18% and an acetate content of about 7%, having a viscosity of 400 cps. in a 10% solution was dissolved in 100 g. of a mixture of 50 ccs. of propanol-2 and 50 ccs. of ethanol. A short time before the exposure this mixture was mixed with a fresh mixture of 25 ccs. of ethanol, 25 ccs. of propanol-2, 50 ccs. of mono-ethyl-glycolether and 2 ccs. of a 10% solution of ammonium-bichromate in water. A layer of this mixture is applied to a copper-plated stainless steel plate. Subsequently to exposure under a stencil and washing-out the non-exposed portions with ethanol, the plate is etched in a solution of 40% of ferrichloride until the copper plating is etched off from this plate. The plate thus obtained is used for manufacturing off-prints of the image on paper with the aid of ink.

*Example 2*

A solution of the kind referred to under Example 1 is applied to a copper plate of a few mms. in thickness and the layer thus obtained is exposed under a stencil. Subsequently to washing out the non-exposed portions with ethanol, the copper surface set free at the areas concerned is etched with a solution of ferri-chloride to such a depth that the plate, stretched on a cylinder, may be used for rotary intaglio printing.

*Example 3*

A solution of the kind referred to under Example 1 is applied to an iron plate of ½ mm. in thickness and the layer obtained on this plate is exposed under a stencil. Subsequently to washing out the non-exposed areas, the rear side of the metal plate is coated with a thin protective lacquer layer, then the plate is immersed in a solution saturated with salt. The iron plate is connected as an anode. After a short time the plate is etched through at the areas where the layer has been washed away and the metal plate has openings corresponding to the stencil.

*Example 4*

A solution of the kind referred to under Example 1 is applied to a plate of a few millimetres in thickness of a synthetic resin, coated with a thin metal layer. The layer is exposed under a stencil, having the image of an electrical circuit. Subsequently to washing out the plate is immersed in a solution of diluted acid, so that at the areas where the image has been washed away the metal is dissolved. The insulating substratum exhibits a reproduction of the electrical circuit.

*Example 5*

A solution of the kind referred to under Example 1 is applied to a metal plate of copper and the layer obtained is exposed through a stencil having a decorative pattern. Subsequently to washing out a nickel layer is applied to the free copper areas where the image has been washed away in a nickelplating bath. A copper plate having a decorative figure in nickel is obtained.

*Example 6*

A solution of the kind referred to under Example 1 is applied to a glass plate coated with a reflective aluminum layer applied by vaporisation and the layer obtained is exposed through a stencil. Subsequently to washing out of the non-exposed portions and the removal of the mirror from the portions set free with the aid of lye, a partly reflective glass plate is obtained.

What is claimed is:

1. A method of producing a pattern having exposed metal surfaces adapted to be further modified comprising the steps of applying to the metal surface, a layer consisting of polyvinyl butyral resin having a degree of polymerization at which a 10% solution in ethanol has a viscosity between 200 and 1000 centipoises and a photo-sensitive bichromate compound capable, upon exposure to actinic light, of further polymerizing exposed areas of the polyvinyl butyral layer to an insoluble condition, exposing the polyvinyl butyral resin layer to actinic light to insolubilize the exposed portions thereof and render the same highly adherent to the underlying metal surface, and washing out the unexposed portions of the polyvinyl butyral resin layer thereby leaving exposed underlying portions of the metal surface.

2. A method of producing a pattern having exposed metal surfaces adapted to be further modified comprising the steps of applying to a metal surface, a layer consisting of polyvinyl butyral resin having a degree of polymerization at which a 10% solution in ethanol has a viscosity between 200 and 1000 centipoises and ammonium bichromate, exposing the polyvinyl butyral resin layer to actinic light to insolubilize the exposed portions thereof and render the same highly adherent to the underlying metal surface, and washing out the unexposed portions of the polyvinyl butyral resin layer thereby leaving exposed underlying portions of the metal surface.

References Cited in the file of this patent

UNITED STATES PATENTS

| | | |
|---|---|---|
| 717,369 | Epstein | Dec. 30, 1902 |
| 2,072,303 | Hermann et al. | Mar. 2, 1937 |
| 2,078,535 | Hagedorn et al. | Apr. 27, 1937 |
| 2,100,063 | Zahn | Nov. 23, 1937 |
| 2,253,078 | Lowe | Aug. 19, 1941 |
| 2,310,943 | Dorough et al. | Feb. 16, 1943 |
| 2,405,523 | Sease et al. | Aug. 6, 1946 |
| 2,666,701 | West | Jan. 19, 1954 |

FOREIGN PATENTS

| | | |
|---|---|---|
| 445,845 | Great Britain | July 17, 1934 |